(12) United States Patent
Roewe et al.

(10) Patent No.: US 9,035,687 B2
(45) Date of Patent: May 19, 2015

(54) GATE CLAMPING

(71) Applicant: Infineon Technologies AG, Neubiberg (DE)

(72) Inventors: Tom Roewe, Unterhaching (DE);
Laurent Beaurenaut, Neubiberg (DE);
Jens Barrenscheen, München (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/049,983

(22) Filed: Oct. 9, 2013

(65) Prior Publication Data

US 2015/0097613 A1    Apr. 9, 2015

(51) Int. Cl.
*H03K 5/08*    (2006.01)
*H03K 17/082*    (2006.01)
*H03K 17/16*    (2006.01)

(52) U.S. Cl.
CPC .......... *H03K 17/0822* (2013.01); *H03K 17/165* (2013.01); *H03K 2217/0054* (2013.01)

(58) Field of Classification Search
USPC .......................... 327/309, 310, 312, 323, 324
See application file for complete search history.

(56) References Cited

U.S. PATENT DOCUMENTS

| 7,129,759 | B2 * | 10/2006 | Fukami | 327/110 |
| 7,453,308 | B2 * | 11/2008 | Tihanyi | 327/309 |
| 7,576,964 | B2 * | 8/2009 | Nakahara | 361/91.1 |
| 7,606,015 | B2 | 10/2009 | Tanabe | |
| 7,768,752 | B2 | 8/2010 | Souma | |
| 8,031,450 | B2 | 10/2011 | Nakahara | |
| 8,111,491 | B2 | 2/2012 | Souma | |
| 8,116,051 | B2 | 2/2012 | Nakahara | |
| 8,116,052 | B2 | 2/2012 | Nakahara | |
| 2002/0079944 | A1 * | 6/2002 | Sander | 327/309 |
| 2005/0088216 | A1 * | 4/2005 | Arndt et al. | 327/325 |

\* cited by examiner

*Primary Examiner* — William Hernandez
(74) *Attorney, Agent, or Firm* — Shumaker & Sieffert, P.A.

(57) ABSTRACT

A circuit is described that includes a switch, a switchable clamping element coupled to the switch, and a driver configured to control the switch based at least in part on a driver control signal. The driver is further configured to enable or disable the switchable clamping element. The switchable clamping element is configured to clamp a voltage across the switch when the switchable clamping element is enabled by the driver and when the voltage across the switch or a current at the switch satisfies a threshold for activating the switchable clamping element.

20 Claims, 7 Drawing Sheets

GATE CLAMPING

TECHNICAL FIELD

This disclosure relates to techniques for gate clamping of a switch.

BACKGROUND

Some circuits may use power converters to convert (e.g., boost or buck) an input voltage or current from a power source to a regulated output voltage or current for powering a component, a circuit, or other electrical device. Switch-based power converters may use one or more switches and signal modulation techniques to regulate an output. Stray inductance is a parasitic effect associated with a power converter. Stray inductance can be caused by wiring of the power converter, connections of the power converter, the geometric arrangement of the electrical components of the power converter, the length of a current path of the power converter, the location of decoupling capacitors of the power converter, etc.). A change in a current level in a current path of a power converter can lead to a parasitic voltage pulse over the parasitic or stray inductance. The amplitude of the parasitic voltage pulse may be defined by the size of the stray inductance and the gradient of the current over time (di/dt). This parasitic voltage pulse adds to the normal operating voltage and the sum of both may exceed the tolerated (e.g., rated) voltage of a switch and may lead to destruction of the switch. Furthermore, the parasitic voltage pulse may introduce electromagnetic interference (EMI) based noise into the rest of the power converter and associated system and/or corrupt measurements or general power converter and/or system behavior. For example, parasitic effects and stray inductance can cause over-current, over-voltage, or other types of failures at the one or more switches of a power converter, particularly when a switch transitions between operating in an on-state and an off-state of the switch (e.g., as a switch turns-on or turns-off).

Some power converters may include characteristics or features for limiting parasitic effects and stray inductance. Although parasitic effects and stray inductance can be limited and reduced, some parasitic effects and stray inductance will inevitably be present. Additionally, some power converters may use clamping elements fixed across one or more components of a power converter to protect the components from being damaged by potential or actual over-current, over-voltage, or other failure conditions that may or are occurring during a failure mode of the power converter being induced by parasitic effects and stray inductance. However, using fixed clamping elements may reduce the operating voltage of the power converter and/or decrease the overall efficiency of the power converter system.

SUMMARY

In general, techniques and circuits are described for selectively clamping the voltage and/or current at a switch of a power converter to prevent impending or actual failure conditions (e.g., over-voltages and/or over-currents) from damaging the switch. A power converter (e.g., a buck or boost converter, an inverter, etc.), may include at least one switch and may use signal modulation techniques to turn the switch on and/or off to convert an input voltage into a regulated output voltage and/or current.

The power converter may further include a switchable clamping element for clamping a voltage and/or current across the switch to prevent the voltage and/or current from reaching a level that could damage the switch. When the power converter detects a voltage across the switch that is indicative of a risk of an actual or possible failure condition, the power converter "enables" the switchable clamping element (e.g., turns the switchable clamping element on and causes the switchable clamping element to operate in an on-state). By enabling the switchable clamping element, the power converter configures the switchable clamping element to create an extra current path, through the switchable clamping element, to divert excess current caused by the failure condition away from the switch, in the event that a threshold or other activation criteria of the switchable clamping element is met. When the voltage across the switch is not indicative of a risk of an actual or possible failure condition, the power converter "disables" the switchable clamping element (e.g., turns the switchable clamping element off). By disabling the switchable clamping element, the power converter configures the switchable clamping element to prevent an extra current path from being created, through the switchable clamping element, even if the threshold or the other activation criteria of the switchable clamping element is met.

In one example, the disclosure is directed to a circuit that includes a switch, a switchable clamping element coupled to the switch, and a driver configured to control the switch based at least in part on a driver control signal. The driver is further configured to enable or disable the switchable clamping element. The switchable clamping element is configured to clamp a voltage across the switch when the switchable clamping element is enabled by the driver and when the voltage across the switch or a current at the switch satisfies a threshold for activating the switchable clamping element.

In another example, the disclosure is directed to a method that includes controlling, by a driver configured to control a switch, a switchable clamping element coupled to the switch based at least in part on a voltage across the switch or a current at the switch, wherein the switchable clamping element is configured to clamp the voltage across the switch when the switchable clamping element is enabled by the driver and when the voltage across the switch or the current at the switch satisfies a threshold for activating the switchable clamping element.

In another example, the disclosure is directed to a circuit that includes means for controlling a switchable clamping element coupled to a switch based at least in part on a voltage across the switch or a current at the switch, wherein the switchable clamping element is configured to clamp the voltage across the switch when the switchable clamping element is enabled by the driver and when the voltage across the switch or the current at the switch satisfies a threshold for activating the switchable clamping element.

The details of one or more examples are set forth in the accompanying drawings and the description below. Other features, objects, and advantages of the disclosure will be apparent from the description and drawings, and from the claims.

DETAILED DESCRIPTION

In some applications, a power converter (hereafter referred to as a "converter") may convert (e.g., by boosting or bucking) an input voltage or current from a power source to a regulated output voltage or current for a device (e.g., a load). The converter may have a half-bridge that includes one or more switches (e.g., MOS power switch transistors, gallium nitride (GaN) based switches, or other types of switch devices). For example, a half-bridge may include a high-side switch coupled to a low-side switch at a switching node. By controlling the switches of the half-bridge using modulation techniques, the converter can regulate the amount of current or voltage at the switching node of the half-bridge. Such modulation of the switches of the half-bridge may operate according to pulse-width-modulation (PWM), pulse-density-modulation (PDM), or another suitable modulation technique.

Failure conditions (e.g., voltage or current spikes that exceed the voltage rating or current rating of the components of the half-bridge) may occur at a switch during a switching cycle, as a switch turns on or turns off, due to stray inductance levels at the switch. For example, the power converter may be susceptible to some amount of electrical noise or radiation that causes an overcurrent and/or overvoltage spike across a switch. The overcurrent, overvoltage, or other type of failure condition may produce a current and/or voltage level at the switch that exceeds the operational rating of the switch and may cause damage to the switch. In some cases, switches with higher operational tolerances are used in a power converter to account for possible overcurrent, overvoltage, or other failure conditions. Switches with higher operational tolerances may impose higher costs on the circuit.

Some power converters may include characteristics to minimize EMI and noise due to stray inductance at a switch and as such, limit the frequency and or intensity of an overcurrent, overvoltage, or other failure condition to prevent a voltage or current at a switch from exceeding the operational rating of the switch. For instance, some power converters may include extra shielding to minimize the amount of external electrical radiation and noise at a switch. Although some power converters may be designed and/or operated to minimize EMI and noise, EMI and noise at a switch of a power converter can almost never be completely eliminated or limited to a zero level.

Some power converters may include what is referred to as a "fixed clamping element" or "fixed clamper" (e.g., a Zener diode, a transient voltage suppressant (TVS) diodes, an avalanche diode, or other electrical circuits and/or components that may be used as a "clamper" to suppress a voltage and/or current) arranged across a switch and configured to suppress voltage and/or current spikes at the switch and to protect against potential damage that may be caused by a failure condition at the switch. For instance, some power converters may include a Zener diode arranged across a switch and configured to operate as a fixed clamping element. When the voltage at the switch, and across the fixed clamping element, satisfies a threshold or other activation criteria of the fixed clamping element (e.g., when the voltage at the switch exceeds the break-down voltage of the Zener diode), a current path is created through the fixed clamping element. The current path diverts excess current through the fixed clamping element and protects the switch against overvoltage. As a result of the extra current path created by the fixed clamping element, the voltage across the switch is limited or clamped, at a level that remains at or below the threshold of the fixed clamping element (e.g., the breakdown voltage of the Zener diode). In other words, the fixed clamping element limits the voltage at the switch from exceeding the threshold of the fixed clamping element and the maximum voltage for the switch.

Throughout this disclosure, the terms "clamping element" and "clamper" are used to describe any electrical device, component, or circuit used for suppressing or clamping a voltage and/or current. Use of the terms "fixed clamper" and "fixed clamping element" are used to refer to clampers and clamping elements that cannot be "disabled" or "turned-off". For example, by being fixed, a fixed clamper or fixed clamping element cannot be disabled and prevented from forming a current path through the fixed clamper or fixed clamping element if the voltage across the fixed clamping element or fixed clamper satisfies the threshold or other activation criteria of the fixed clamping element. In other words, with a fixed clamper or fixed clamping element, a current path always forms through the fixed clamper of fixed clamping element if the threshold or other activation criteria is satisfied.

Various types of switchable clamping elements are described below and the circuits and techniques described apply generally to each of these types of switchable clamping elements. For instance, one type of switchable clamping element is a "normally-enabled" (e.g., "normally-on") type switchable clamping element. A normally-enabled or normally-on type switchable clamping element refers to a switchable clamping element that can clamp a voltage across a switch even if a driver is not controlling the switchable clamping element and/or the driver is not powered. If the driver is connected, the driver can control the switchable clamping element to disable the switchable clamping element otherwise the normally-enabled or normally-on type switchable clamping element is enabled. In some examples, a normally-on type switchable clamping element may be modeled as a normally-on transistor (e.g., a depletion MOS transistor) in series with a clamper.

A second type of switchable clamping element is a "normally-disabled" (e.g., "normally-off") type switchable clamping element. A normally-disabled or normally-off type switchable clamping element refers to a switchable clamping element that cannot clamp a voltage across a switch unless a driver is not controlling the switchable clamping element and/or the driver is powered for enabling the switchable clamping element. If the driver is connected, the driver can control the switchable clamping element to enable the switchable clamping element otherwise the normally-disabled or normally-off type switchable clamping element is disabled. In some examples, a normally-off type switchable clamping element may be modeled as a normally-off transistor (e.g., an enhancement MOS transistor) in series with a damper.

By using fixed clamping elements that rely solely on thresholds (e.g., the breakdown voltage) or other activation criteria to protect switches from failure conditions, power converters may be limited by the fixed clamping elements from operating at higher working voltages that exceed the thresholds or other activation criteria of the fixed clamping elements. In other words, the maximum working voltage of some power converters that use fixed clamping elements may be based on the thresholds or other activation criteria of the fixed clamping elements, rather than being based on the actual voltage rating of the switches of the power converters. For this reason, fixed clamping elements may prevent some power converters from operating outside a tolerance window of the fixed clamping elements, even though the switches being protected by the fixed clamping elements may have voltage ratings that indicate that the switches can be operated at a higher working voltage that exceed this tolerance window.

The risk of overvoltage at the switch due to a parasitic voltage pulse introduced by stray inductance can be reduced either by slowing down the switching speed (lower di/dt) or reducing the normal operating voltage. Both slowing down the switching speed and reducing the normal operating voltage may have negative impact on the overall efficiency of a power converter. Slower switching speed may lead to more switching losses, because the length of the transition time between the on-state and the off-state (and vice versa) of a switch is increased. Reducing the normal operating voltage may lead to an increased demand of current to achieve the same rated power. This may lead to more conduction losses and perhaps also to more expensive components supporting the higher current demand In some power converters, the drawbacks described above with using fixed clamping elements (e.g., causing a reduced working voltage, etc.) may be overcome by using higher voltage class fixed clamping elements (e.g., fixed clamping elements that have inherently higher thresholds, a higher breakdown voltage, or other enhanced activation criteria). For instance, some power converters may use higher voltage class fixed clamping elements that have breakdown voltages that are at the same voltage level as the voltage rating of the switches that the fixed clamping elements protect. However, like higher voltage class switches, higher voltage class fixed clamping elements may invariably increase cost and size of the power converter.

In general, circuits and techniques of this disclosure may enable a power converter to selectively enable or turn-on a "switchable clamping element" to protect a switch of the power converter from failure conditions at the switch if the power converter determines that a failure condition may occur or is occurring at the switch. Once enabled, the switchable clamping element is configured to create a current path through the switchable clamping element if a threshold or other activation criteria of the switchable clamping element is met.

The current path created through an enabled or turned-on, switchable clamping element may divert current away from a switch during a failure condition (e.g., overvoltage or overcurrent at the switch) and protect the switch from being damaged by the failure condition. However the current path created through an enabled or turned-on switchable clamping element may also prevent the switch from operating at a working voltage level that exceeds the threshold or other activation criteria of the switchable clamping element.

To allow the switch to operate at higher working voltages (e.g., voltage levels that exceed the threshold or other activation criteria of the switchable clamping element), the power converter may selectively disable or turn-off the switchable clamping element if the power converter determines that a failure condition is not likely to occur at the switch. By disabling or turning-off the switchable clamping element, the switchable clamping element is prevented from creating the excess current path through the switchable clamping element, even if a threshold or other activation criteria of the switchable clamping element is satisfied. By disabling the switchable clamping element, and preventing an excess current path from being created through the switchable clamping element, the power converter can operate the switch at a higher working voltage level (e.g., a voltage level that exceeds the threshold or activation criteria of the switchable clamping element) than the working voltage that the switch is limited to operating at when the switchable clamping element is enabled.

Rather than use one or more fixed clamping elements like some other power converters, the power converter according to the circuits and techniques described herein uses one or more switchable clamping elements that can be can selectively enabled or turned-on to protect a switch from a failure condition in the event that a failure condition occurs at the switch and can further be selectively turned-off or disabled when the voltage at the switch indicates that no failure condition is likely to occur. Since the selectable clamping element is not permanently enabled or turned-on, a failure condition at a switch of the power converter is not necessarily tied to the breakdown voltage of a clamping element. The power converter can operate at an increased working voltage (e.g., a voltage that exceeds the breakdown voltage of the switchable clamping element) and may operate with a greater efficiency, and with fewer switching losses, than some other power converters that use fixed clamping elements. In addition, the power converter can account for possible overcurrent and/or overvoltage conditions using lower rated (e.g., voltage and/or current) and/or lower tolerance switches (relative to some conventional techniques) thereby helping to reduce implementation cost of the power converter.

Throughout the disclosure, the term failure conditions is used to describe both actual voltage and/or current spikes that could damage a switch of a power converter as well as voltage and/or current levels that indicate an impending failure condition, or a voltage or current level to which could reach a level of an actual failure condition. A failure condition may correspond to a voltage or current spike that exceeds the voltage or current rating of a switch and is not necessarily tied to the threshold or other activation criteria (e.g., breakdown voltage) of a clamping element.

Figure 1:
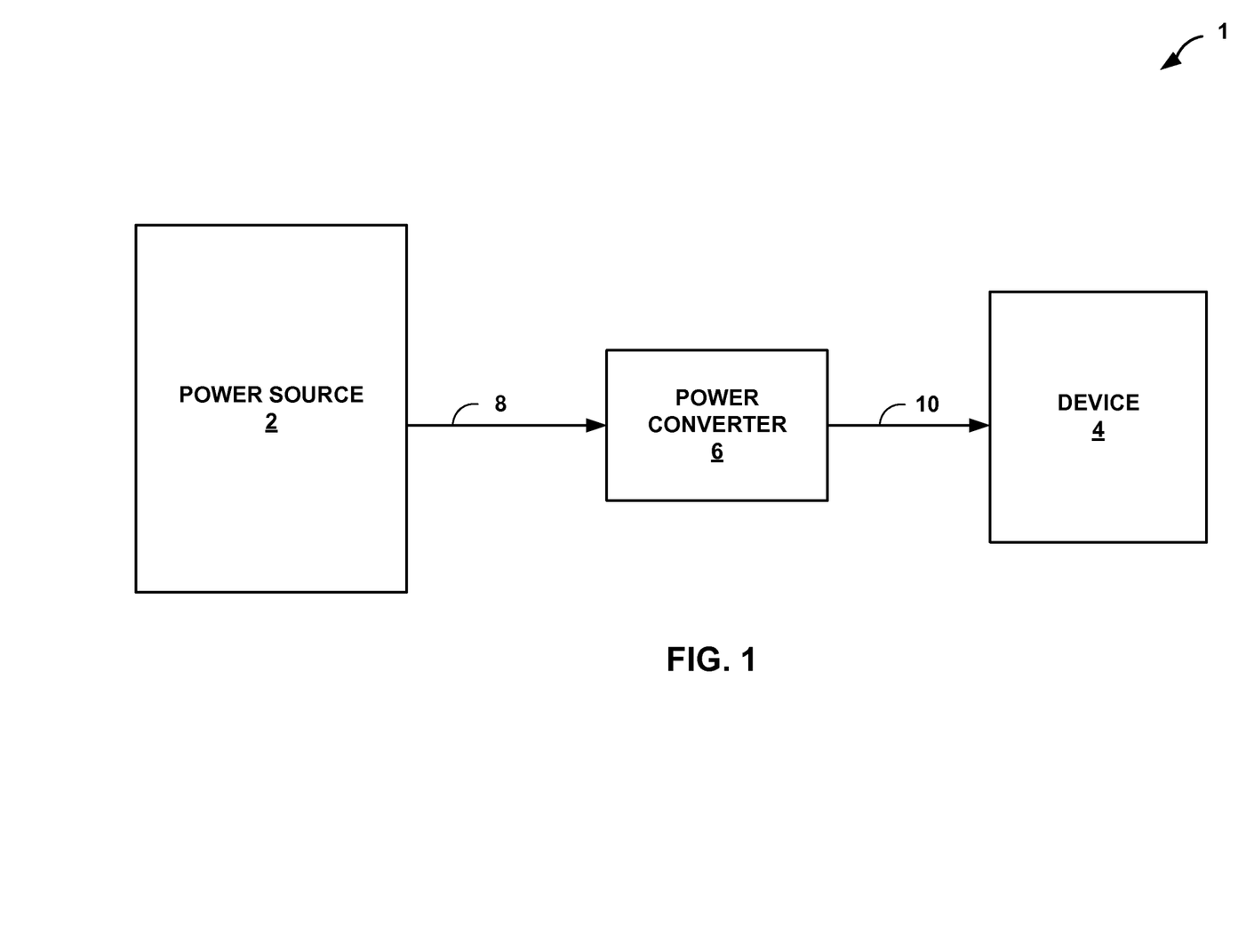
FIG. 1 is a block diagram illustrating an example system for converting power from a power source, in accordance with one or more aspects of the present disclosure.

FIG. 1 is a block diagram illustrating an example system for converting power from a power source, in accordance with one or more aspects of the present disclosure. FIG. 1 shows system 1 as having three separate and distinct components shown as power source 2, power converter 6, and device 4, however system 1 may include additional or fewer components. For instance, power source 2, power converter 6, and device 4 may be three individual components or may represent a combination of one or more components that provide the functionality of system 1 as described herein.

System 1 includes power source 2 which provides electrical energy (i.e., power) to system 1. Numerous examples of power source 2 exist and may include, but are not limited to, power grids, generators, power transformers, batteries, solar panels, windmills, regenerative braking systems, hydro electrical generators, or any other form of electrical power devices capable of providing electrical energy in the form of a voltage to system 1.

System 1 includes power converter 6 that operates as a switch-based power converter that converts electrical power provided by power source 2 into a usable form of electrical power for device 4. Examples of power converter 6 may include various types of power supplies, battery chargers, microprocessor or other integrated circuit power supplies, and the like.

System 1 includes device 4 that receives the electrical power (e.g., voltage, current, etc.) converted by power converter 6 and in some examples, uses the electrical power to perform a function. Numerous examples of device 4 exist and may include, but are not limited to, computing devices and related components, such as microprocessors, electrical components, circuits, laptop computers, desktop computers, tablet computers, mobile phones, batteries, speakers, lighting units, automotive/marine/aerospace/train related components, motors, transformers, or any other type of electrical device and/or circuitry that receives electrical power in the form of a voltage or current from a power converter.

Power source 2 may provide a first voltage over link 8 and device 4 may receive a second voltage converted by power converter 6 over link 10. Links 8 and 10 represent any medium capable of conducting electrical energy from one location to another. Examples of links 8 and 10 include, but are not limited to, physical and/or wireless electrical transmission mediums such as electrical wires, electrical traces, conductive gas tubes, twisted wire pairs, and the like. Link 10 provides electrical coupling between power converter 6 and device 4 and link 8 provides electrical coupling between power source 2 and power converter 6. Device 4 is electrically coupled to power converter 6 which is electrically coupled to power source 2.

In the example of system 1, a voltage generated by power source 2 can be regulated and/or converted to a suitable form for use by device 4. For instance, power source 2 may output, and power converter 6 may receive, power at a first voltage level at link 8. The power at the first voltage level may not be suitable for powering device 4. For instance, device 4 may require power at a second voltage level that is different (e.g., higher or lower) than the first voltage level associated with the power provided by power source 2. Power converter 6 may convert the power at the first voltage level to power at a second voltage level that is required and suitable for powering device 4. Power converter 6 may output, and device 4 may receive the power at the second voltage level at link 10. Device 4 may use the power at the second voltage level to perform a function (e.g., power a microprocessor).

Figure 2:
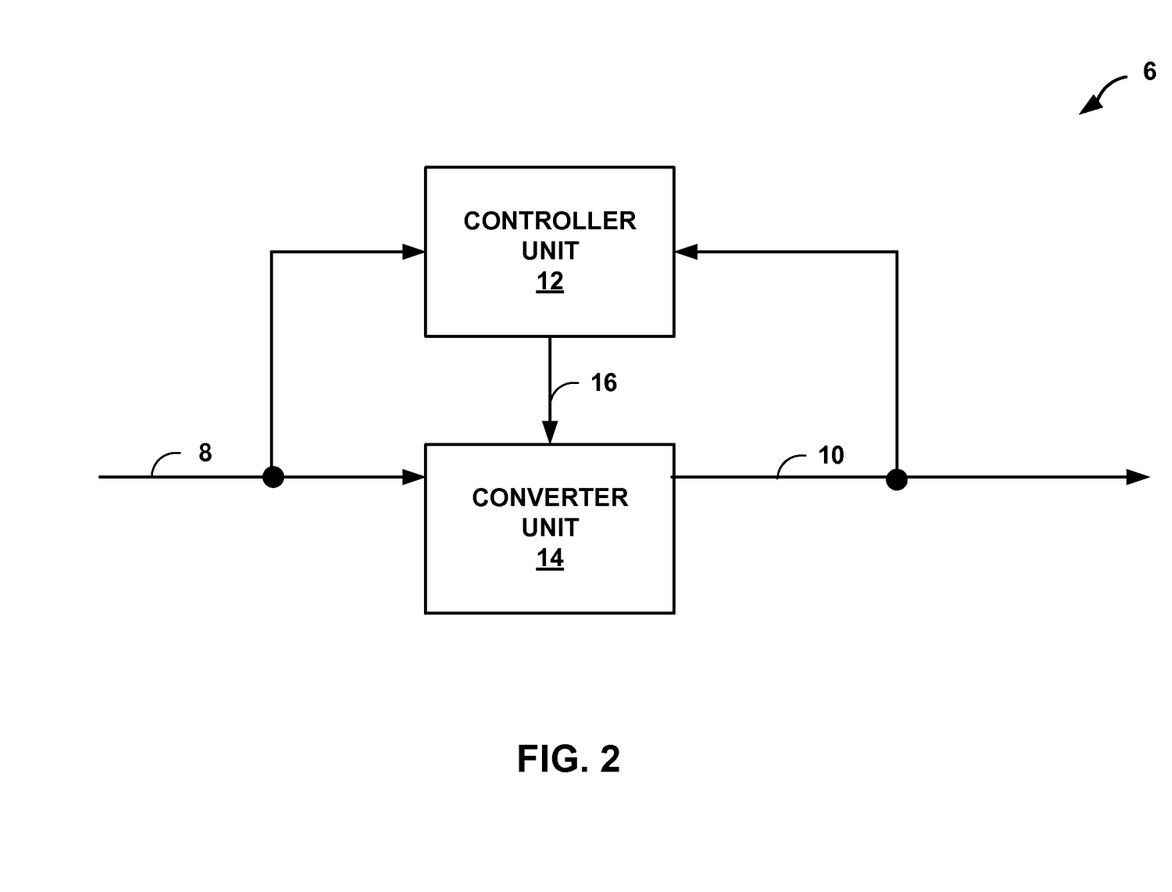
FIG. 2 is a block diagram illustrating one example of a power converter of the example system shown in FIG. 1.

FIG. 2 is a block diagram illustrating one example of a power converter of the example system shown in FIG. 1. In particular, FIG. 2 shows a more detailed exemplary view of power converter 6 of system 1 from FIG. 1 and the electrical connections to power source 2 and device 4 provided by links 8 and 10 respectively.

Power converter 6 is shown as having two electrical components, controller unit 12 and converter unit 14, that power converter 6 uses to convert a power received via link 8 to a different form and/or magnitude of power that power converter 6 outputs at link 10. Power converter 6 may include additional or fewer electrical components than those illustrated in FIG. 2. For instance, in some examples, controller unit 12 and converter unit 14 are a single semiconductor die, electrical component, or circuit while in other examples, more than two dies, components, and/or circuits provide power converter 6 with the functionality of controller unit 12 and converter unit 14.

Converter unit 14 represents a switch-based power conversion element of power converter 6 that converts power received at an input port coupled to link 8 to a different form of power and provides the converted and different form of power at an output port coupled to link 10. Converter unit 14 is described in more detail below, however in general, converter unit 14 may receive power at a first voltage level at a connection (e.g., an input port) coupled to link 8. Converter unit 14 may transmit power at a second voltage level, based at least in part on the power at the first voltage level, at a different connection (e.g., an output port) coupled to link 10. Converter unit 14 may receive a driver control signal or drive command, such as a pulse-width-modulation (PWM) signal, a pulse-density-modulation (PDM) signal, or other signal for controlling converter unit 4 according to some other suitable modulation technique, from controller unit 12 via link 16. Converter unit 14 may use the driver control signal or drive command signal to control the form and magnitude of the power that converter unit 14 outputs at link 10. Converter unit 14 includes a driver circuit or unit for adapting the voltage and current level of the driver control signal at link 16 to the voltage and current level needed to set the switch to its on-state or its off-state.

Converter unit 14 may include one or more switches, gate drivers, half-bridge circuits, H-bridge circuits, input filters, output filters, or combination thereof to provide a power output at link 10 based on a power input received at link 8 and a driver control signal received at link 16. Converter unit 14 may include one or more switch devices, capacitors, resistors, transistors, transformers, inductors, clamping elements, and/or other electrical components or circuits that are arranged within converter unit 14 for providing the power output at link 10.

For example, converter unit 14 may include a half-bridge arranged in parallel to an input port of power converter 6 that includes a first switch (e.g., a high-side switch) coupled to a second switch (e.g., a low-side switch) at a switching node. A driver may be coupled to the first switch of the half-bridge and may be configured to control the first switch based on a driver control signal (e.g., PWM, PDM, and the like). In addition, converter unit 14 may include one or more switchable clamping elements coupled to the first switch for clamping a voltage across the first switch when both, the switchable clamping element is enabled or caused to operate in an on-state of the switchable clamping element by the driver, and also, when a threshold or other activation criteria of the switchable clamping element is satisfied. The switchable clamping element is described in greater detail below with respect to the other figures. In some examples, the driver of converter unit 14 may control (e.g., enable/disable or turn-on/turn-off) the switchable clamping element based on a voltage level and/or current level detected at the first switch that indicates to the driver that a failure condition is about to occur or is occurring at the first switch. In other examples, controller unit 12 or another circuit of converter unit 14 may control (e.g., enable/disable or turn-on/turn-off) the switchable clamping element in the event that an impending or actual failure condition is detected at the first switch.

Controller unit 12 of power converter 6 may provide a driver control signal or drive command to converter unit 14 via link 16 to control the form and magnitude of power that converter unit 14 outputs at link 10. For example, controller unit 12 may generate a PWM signal or other signal associated with some other suitable modulation technique, based on the voltage level of a power input at link 8 and/or link 10. In other examples, controller unit 12 may generate a PDM signal or other signal associated with some other suitable modulation technique, based on the voltage level of a power input detected at link 8 and/or link 10. In other words, controller unit 12 may provide power converter 6 with a driver control signal for modulating (e.g., controlling) the switching pattern of the switches of the half-bridge of converter unit 14 to cause converter unit 14 to output power at link 10 that has a modulated voltage level that is at least based on, the voltage level of the power input at link 8 and/or link 10.

For example, controller unit 12 may provide a PWM signal over link 16 that causes a driver of converter unit 14 to cause a switch to transition between operating in an on-state and an off state (e.g., to turn-on a switch or turn-off a switch). In response to the voltage level of the power input at link 8, controller unit 12 may vary the duty cycle of the PWM signal to adjust the points in time that the driver causes the state of the switches to change. By varying the duty cycle of the driver control signal, controller unit 12 may alter the form or magnitude of the power output (e.g., alter the voltage level of the power output) provided by converter unit 14 at link 10.

In other examples, controller unit 12 may provide a PDM signal over link 16 that causes a driver of converter unit 14 to cause a switch of a half-bridge to transition between operating in an on-state and an off-state. In response to the voltage level of the power input at link 8, controller unit 12 may vary the average value of the PDM signal to adjust the frequency that the driver causes the state of the switches to change. By varying an average value of the PDM signal, controller unit 12 may alter the form or magnitude of the power output (e.g., alter the voltage level of the power output) provided by converter unit 14 at link 10.

Controller unit 12 can comprise any suitable arrangement of analog and/or digital hardware, software, firmware, or any combination thereof, to perform the techniques attributed to controller unit 12 herein. For example, controller unit 12 may include any one or more microprocessors, signal processors, application specific integrated circuits (ASICs), field programmable gate arrays (FPGAs), or any other equivalent integrated, digital, analog, or discrete logic circuitry, as well as any combinations of such components. When controller unit 12 includes software or firmware, controller unit 12 further includes digital and/or analog hardware for storing and executing the software or firmware, such as one or more processors or processing units. In general, a processing unit may include one or more microprocessors, signal processors, ASICs, FPGAs, or any other equivalent integrated, digital, analog, or discrete logic circuitry, as well as any combinations of such components. Although not shown in FIG. 2, controller unit 12 may include a memory configured to store data. The memory may include any volatile or non-volatile media, such as a random access memory (RAM), read only memory (ROM), non-volatile RAM (NVRAM), electrically erasable programmable ROM (EEPROM), flash memory, and the like. In some examples, the memory may be external to controller unit 12 and/or power converter 6, e.g., may be external to a package in which controller unit 12 and/or power converter 6 is housed.

Figure 3:
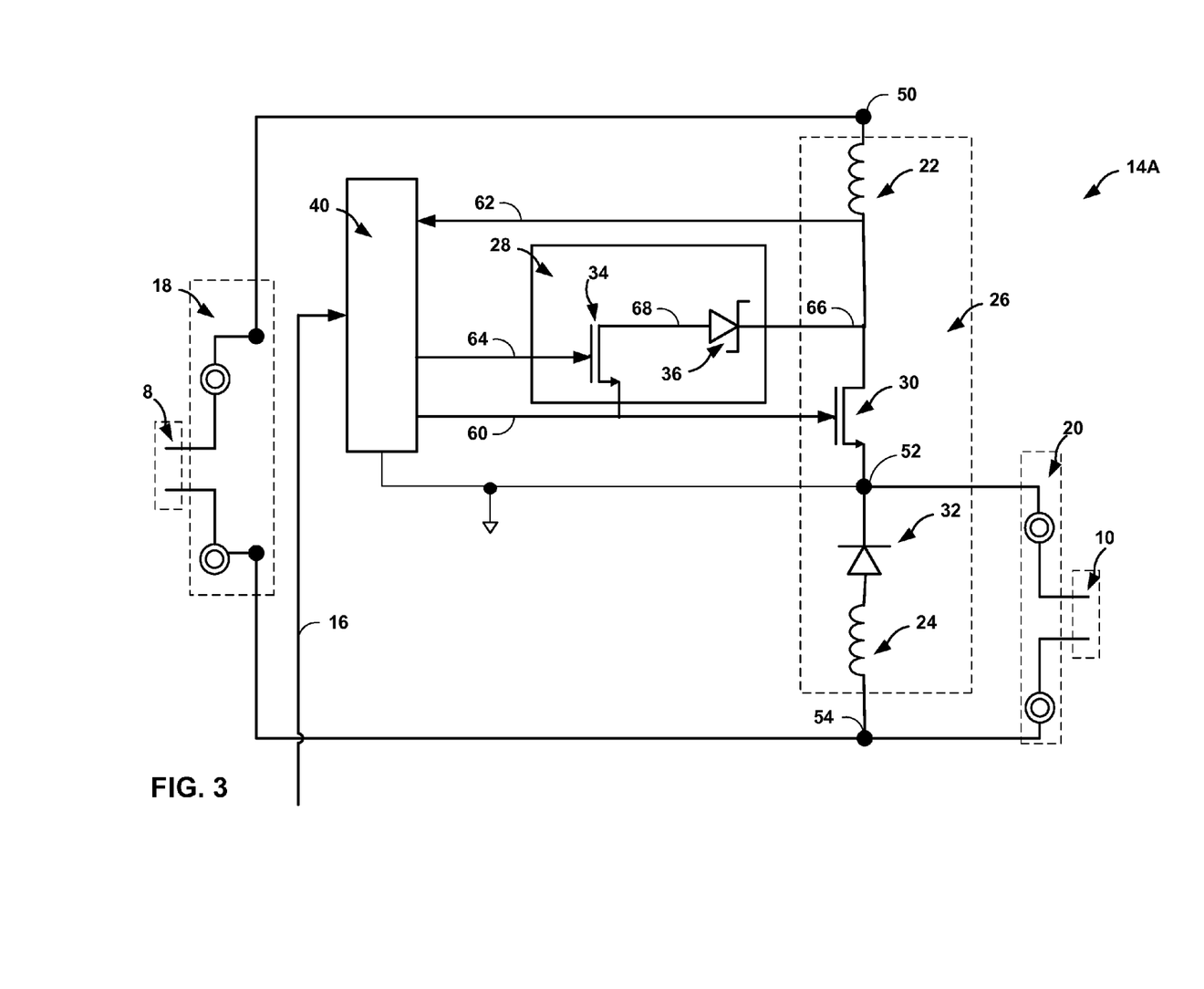
FIG. 3 is a circuit diagram illustrating an example converter unit that includes improved gate clamping, in accordance with one or more aspects of the present disclosure.

FIG. 3 is a circuit diagram illustrating an example converter unit that includes improved gate clamping, in accordance with one or more aspects of this disclosure. For instance, FIG. 3 shows converter unit 14A which represents a more detailed exemplary view of converter unit 14 of power converter 6 from FIG. 2. FIG. 3 is described below within the context of system 1 of FIG. 1 and power converter 6 of FIG. 2.

Converter unit 14A includes port 18, port 20, half-bridge 26, switchable clamping element 28, and driver 40. Half-bridge 26 includes switch 30 coupled to switch 32 at switching node 52. Half-bridge 26 is arranged in parallel to port 18 with a first terminal of switch 30 being coupled to node 50 and a second terminal of switch 32 being coupled to node 54. FIG. 3 illustrates half-bridge 26 as having stray inductors 22 and 24 to model stray inductance based on electrical noise or other radiation received at half-bridge 26. The stray inductance at half-bridge 26 may cause an over-current, an over-voltage, or other type of failure condition at half-bridge 26, particularly when (as described below) converter unit 14A causes switches 30 and 32 to transition between operating in an on-state and an off-state (e.g., turn-on or turn-off). In some examples, one filter (e.g., an output filter) may be placed at port 20, and different filter (e.g., an input filter) may be placed at port 18 to reduce stray inductance. For ease of description, these input and/or output filters are not shown in FIG. 3.

FIG. 3 is described below in the context of converter unit 14A operating as a buck or step-down converter for converting a power input to a power output that has voltage level that is less than the voltage level of the power input. In some examples, converter unit 14A may be a boost or step-up converter for converting the power input to a power output that has a higher voltage level than the voltage level of the power input.

For example, operating as a buck or step-down converter, converter unit 14A may receive a power input at an input voltage level transmitted across link 8 at port 18 (e.g., an input port) and provide a power output at an output voltage level that is less than the input voltage level across link 10 at port 20 (e.g., an output port). In some examples, operating as a boost or step-up converter, port 18 may be coupled to link 10 and port 20 may be coupled to link 8 and converter unit 14A may receive a power input at an input voltage level at port 20 (e.g., an input port) and provide a power output at an output voltage level that is greater than the input voltage level at port 18 (e.g., an output port).

Port 18 includes two terminals corresponding to nodes 50 and 54 of converter unit 14A. Port 20 includes two terminals corresponding to switching node 52 of half-bridge 26 and node 54. Although not shown, ports 18 and 20 may include one or more filters for filtering the power input and/or power output received and transmitted by converter unit 14A. For example, an output filter (e.g., an inductor and capacitor) may be arranged between switching node 52 and a terminal of port 20 when converter unit 14A operates as a step-down converter and an output filter may be arranged between node 50 and a terminal of port 18 when converter unit 14A operates as a step-up converter. Converter unit 14A may use modulation techniques (e.g., PWM, PDM, or other suitable modulation techniques) to provide a power output having an output voltage level and/or an output current level at switching node 52 that is based on an input voltage level of a power input received across half-bridge 26 at port 18 and at port 20.

Switch 30 may comprise a high-side switch of half-bridge 26 and switch 32 may comprise a low-side switch of half-bridge 26. Many examples of switch 30 and switch 32 exist, and these switches can be any type of switch devices that when arranged in a half-bridge configuration are suitable for stepping-down or stepping-up (e.g., bucking or boosting) an voltage level of a power input up or down to a an output voltage level of a power output at switching node 52. For instance, some examples of switch 30 and switch 32 may include Silicon (Si) based switching devices, Gallium Nitride (GaN) based switching devices, and/or Silicon Carbide (SiC) based switching devices, GaN high-electron-mobility transistors (HEMT) based switch devices, metal-oxide-semiconductor (MOS) based switch devices, field-effect transistors (FET) based switch devices, N-type MOSFET based switch devices, P-type MOSFET based switch devices, diodes, HEMT FETs (GaN), JFETs (SiC, normally on), IGBT switch devices, or any other type of power switch transistors, switching elements, or switch devices.

Driver 40 comprises a gate driver for controlling switch 30 and switchable clamping element 28. In other examples, not shown, controller unit 12 may send a signal over link 16 that allows controller unit 12 to directly control switchable clamping element 28. In some examples, for instance when switch 32 is a controllable switch device and not a diode, converter unit 14A includes an additional driver for controlling switch 32. Driver 40 may include additional connections than those illustrated in FIG. 3. For instance, driver 40 may include a connection to a potential or current source and a connection to a local reference potential.

In the example of FIG. 3, driver 40 is coupled to switch 30 such that an output produced by driver 40 over link 60 may cause switch 30 to transition from operating between an on-state and an off-state. Said differently, driver 40 may cause switch 30 to "turn-on" or "turn-off" by outputting a signal over link 60. Driver 40 is configured to control (e.g., turn-on or turn-off) switch 30 based at least in part on a driver control signal received over link 16. For example, controller unit 12 of power converter 6 may send a driver control signal across link 16 to cause converter unit 14A to modulate switches 30 and/or 32. Based on the driver control signal received over link 16, driver 40 may produce an output at link 60 that causes switch 30 to transition between operating in an on-state of switch 30 and an off-state of switch 30 to modulate the voltage level of a power output at switching node 52.

As shown in FIG. 3, driver 40 is coupled to switchable clamping element 28 such that an output produced by driver 40 over link 64 may enable switchable clamping element 28 thereby causing switchable clamping element 28 to transition from operating between an on-state and an off-state (e.g., turn-on or turn-off). Said differently, driver 40 may enable switchable clamping element 28 and cause switchable clamping element 28 to "turn-on" by outputting one signal over link 64. Likewise, driver 40 may disable switchable clamping element 28 and cause switchable clamping element 28 to "turn-off" by outputting a different signal over link 64.

Driver 40 is configured to control switchable clamping element 28 (e.g., enable or disable switchable clamping element 28) based at least in part on a voltage level and/or a current level detected by driver 40 at switch 30. For instance, driver 40 can receive information over link 62 that indicates a voltage level across switch 30 and/or a current at switch 30. Based at least in part on the voltage level detected across switch 30 and/or the current at switch 30, driver 40 may enable switchable clamping element 28 and cause switchable clamping element 28 to transition from operating in an off-state to an on-state or disable switchable clamping element 28 and cause switchable clamping element 28 to transition from operating in an on-state to an off-state.

Switchable clamping element 28 is coupled to switch 30 for clamping a voltage across switch 30 when switchable clamping element 28 is both enabled by driver 40, and when a threshold or other activation criteria of switchable clamping element 28 is satisfied. When switchable clamping element 28 is disabled by driver 40, switchable clamping element 28 is prevented from clamping a voltage across switch 30, even if the threshold or other activation criteria of switchable clamping element 28 is satisfied.

For example, switchable clamping element 28 may include switch 34 and clamper 36. Clamper 36 is shown as a Zener diode however clamper 36 may include a transient voltage suppressant diode, an avalanche diode, or other electrical circuits and/or components that may be used as a clamper to suppress a voltage and/or current across switch 30. Clamper 36 may have properties or characteristics that rely on a threshold or other activation criteria of damper 36 that, if satisfied, cause a current path to form through clamper 36. For example, if the voltage level across clamper 36 is greater than or equal to a breakdown voltage associated with clamper 36, a current path may form through clamper 36 that may otherwise not exist if the voltage level across clamper 36 is less than the breakdown voltage.

To control switchable clamping element 28, driver 40 may output one or more signals or commands over link 64 to cause switch 34 of switchable clamping element 28 to transition between operating in an on-state and an off-state. When driver 40 causes switch 34 to operate in the on-state, driver 40 enables switchable clamping element 28. Once enabled, and if and when a voltage level at switch 30 reaches the breakdown voltage of clamper 36, a current path may form over link 66 and through clamper 36 and switch 34 to prevent the voltage at switch 30 from exceeding the breakdown voltage of clamper 36. When driver 40 causes switch 34 to operate in the off-state, driver 40 disables switchable clamping element 28. Once disabled, a current path is prevented from forming over link 66 and through clamper 36 and switch 34, even if the voltage level at switch 30 reaches or exceeds the breakdown voltage of clamper 36. Said differently, by disabling switchable clamping element 28, driver 40 causes an open circuit to form through switchable clamping element 28 thus configuring switch 30 to operate at working voltages that may exceed the breakdown voltage of clamper 36.

Power converter 6 may receive a power input at input port 18 as source 2 applies power across link 8. Driver 40 may receive a driver control signal via link 16 from controller unit 12 for controlling switch 30 (e.g., in accordance with one or more modulation techniques). Controller unit 12 may provide the driver control signal to driver 40 cycle switch 30 and/or switch 32 and cause switch 30 and/or switch 32 of half-bridge 26 to transition between operating in an on-state and an-off state in accordance with a modulation technique used by power converter 6 to produce a power output at output port 20 that has a voltage and/or current level that is based on the voltage level of the power input at input port 18. Driver 40 may control switch 30 of half-bridge 26 based at least in part on the driver control signal. Driver 40 may cause switch 30 to transition between operating in an on-state of switch 30 and an off-state of switch 30 (e.g., turn-on and turn-off) to produce a power output at switching node 52 that has a voltage level based on the voltage level of the power input at input port 18.

Driver 40 may periodically and/or continuously determine whether a failure condition exists or is about to occur at switch 30 (e.g., based on the voltage level and/or current level detected at switch 30) and control switchable clamping element 28 accordingly. Said differently, driver 40 may enable or "turn-on" switchable clamping element 28 after detecting a voltage across switch 30 and/or a current at switch 30 that indicates to driver 40 that a failure condition (e.g., overcurrent, overvoltage, etc.) is occurring or is about to occur at switch 30. By enabling or turning-on switchable clamping element 28, driver 40 configures switchable clamping element 28 for providing a current path to protect switch 30, in the event that the threshold or other activation criteria of switchable clamping element 28 is satisfied. Driver 40 may likewise disable switchable clamping element 28 after detecting a voltage across switch 30 and/or a current at switch 30 that indicates to driver 40 that no failure condition (e.g., overcurrent, overvoltage, etc.) is occurring or is likely to occur at switch 30. By disabling or turning-off switchable clamping element 28, driver 40 configures switchable clamping element 28 to prevent a current path through switchable clamping element 28, even if the threshold or other activation criteria of switchable clamping element 28 is satisfied.

Driver 40 may control (e.g., enable or disable) switchable clamping element 28 by sending control commands over link

64. If driver 40 detects a failure condition occurring or about to occur at switch 30 based on the voltage across switch 30 or the current at switch 30, driver 40 may enable or turn-on switchable clamping element 28 by sending a command or signal across link 64 that causes switchable clamping element 28 remain operating in an on-state or to transition from operating in an off-state and begin operating in the on-state. Otherwise, if driver 40 does not detect a failure condition occurring or about to occur at switch 30 based on the voltage at switch 30 or the current at switch 30, driver 40 may disable or turn-off switchable clamping element 28 by sending a command or signal across link 64 to cause switchable clamping element 28 to remain operating in an off-state or to transition from operating in an on-state and begin operating in the off-state.

Driver 40 may detect a failure condition at switch 30 based on whether a voltage or current level at switch 30 satisfies a threshold or not. If the voltage or current level satisfies the particular threshold, driver 40 may determine that a failure condition is occurring at switch 30, a failure condition is likely to occur at switch 30, or a failure condition is not likely to occur at switch 30. Said differently, driver 40 may determine whether the voltage or current at switch 30 is at a level or may reach a level that could damage switch 30, or if the voltage or current at switch 30 is at a level that indicates tolerable noise or intentional voltage or current spikes in the system.

For example, driver 40 may detect a voltage/current level at link 62. Driver 40 may compare the voltage/current level to a threshold. The threshold may correspond to a voltage level that fits within a voltage/current operational window or tolerance of switch 30. The comparison of the voltage/current level to the threshold may indicate to driver 40 that an impending failure condition exists at a switch if the voltage/current level is within an unacceptable amount of the maximum or upper bound of the operational voltage/current window or tolerance of the switch. In some examples, the comparison of the voltage/current level to the threshold may indicate to driver 40 that an actual failure condition is occurring if, for instance, the voltage/current level at the switch exceeds the maximum or upper bound of the operational voltage/current window or tolerance of the switch. In some examples, the comparison of the voltage/current level to the threshold may indicate to driver 40 that no failure condition is likely to occur if, for instance, the voltage/current level at the switch is at or near a zero level or is near the minimum or lower bound of the operational voltage/current window or tolerance of the switch.

In some examples, driver 40 (or controller unit 12) may determine that a likelihood associated with a failure condition at switch 30 does not satisfy a probability threshold based on the voltage across switch 30 or the current at switch 30, and driver 40 (or driver 40 in response to a command from controller unit 12) may disable switchable clamping element 28 in response to determining that the likelihood associated with the failure condition at switch 30 does not satisfy the probability threshold. In other words, based on the comparisons described above, between the voltage/current level at link 62 and the threshold, driver 40 or controller unit 12 may determine a probability (e.g., via a look up table or computation) associated with the voltage/current at switch 30. Driver 40 or controller unit 12 may determine a quantified likelihood that a failure condition is occurring, is about to occur, or is less likely to occur at switch 30. Driver 40 or controller 12 may control switchable clamping element 28 in response to and based on the determined likelihood of a failure condition at switch 30.

In some examples, driver 40 may determine whether a failure condition is occurring, is likely to occur, or is less likely to occur at switch 30 in other ways without relying solely on the voltage/current at switch 30. For example, driver 40 may check for potential failure conditions using modulation (e.g., PWM, PDM, etc.) timing analysis techniques or reaction time analysis techniques related to feedback signals.

In some examples, driver 40 may determine the modulation timing being applied to switch 30 (e.g., based on operational characteristics of switch 30 being measured over link 62 or characteristics of the driver control signal received over link 16). Based on the modulation timing, driver 40 may determine whether a failure condition may or may not exist at switch 30 for determining whether to enable or disable switchable clamping element 28.

In some examples, driver 40 may determine the reaction time associated with switch 30 (e.g. how fast switch 30 turns-on or turns-off) in response to a particular (modulation) driver control signal received over link 16. Based on the reaction time associated with switch 30, driver 40 may determine whether a failure condition may or may not exist at switch 30 for determining whether to enable or disable switchable clamping element 28.

In some examples, driver 40 may further detect a transition of a modulation pattern from the driver control signal received over link 16 and based on the modulation pattern, determine whether or not to enable or disable switchable clamping element 28 to protect switch 30. For instance, driver 40 may enable or disable switchable clamping element 28 in response to detecting change from one PWM switch pattern to another. The transition of the PWM pattern may not necessarily indicate that a PWM pattern associated with switch 30 is transitioning, but may instead indicate that a PWM pattern of a different switch is transitioning and could cause a failure condition at switch 30.

In some examples, controller unit 12 may send a command or signal over link 16 to driver 40 to cause driver 40 to enable or disable switchable clamping element 28 based on various operating and/or configuration parameters of power converter 6 that are maintained by controller unit 12. In other words, controller unit 12 may enable or disable switchable clamping element 28 depending on different operating modes or set points of power converter 6. For example, controller unit 12 may cause driver 40 to enable or disable switchable clamping element 28 by transferring configuration data via a configuration means for configuring driver 40 (e.g., link 16 and other logic of driver 40).

In some examples, the maximum operating voltage/current rating of switch 30 may exceed the breakdown voltage of clamper 36. Unlike some power converters that use fixed clamping elements to prevent the voltage across a switch from exceeding the breakdown voltage of the fixed clamping element, driver 40 may determine whether the voltage across switch 30 and/or the current at switch 30 satisfies a threshold for indicating that an actual failure condition (e.g., valid failure condition) may or may not exist or also, a threshold for indicating whether a failure condition may or may not likely occur in the near future. If the voltage merely exceeds the breakdown voltage of clamper 36, but does not satisfy the threshold for indicating a failure condition, driver 40 may disable switchable clamping element 28 to allow switch 30 to operate at a working voltage that exceeds the breakdown voltage of clamper 36, but may not exceed the voltage rating of switch 30. In other words, driver 40 can enable or disable switchable clamping element 28 to allow switch 30 to operate at a working voltage that fits within the working voltage of switch 30 that may exceed the breakdown voltage of damper 36 of switchable clamping element 28.

In some examples, a load (e.g., device 4) may be coupled to port 20 (e.g., output port) for receiving a power output at switching node 52. In some examples, converter 14A may include an H-bridge that includes half-bridge 26 coupled to a second half-bridge at output port 20. The second half-bridge may include a high-side switch coupled to a low-side switch at a switching node of the second half-bridge. A first terminal of port 20 (e.g., an output port) may be coupled to switching node 52 of half-bridge 26 and a second terminal of port 20 may be coupled to the switching node of the second half-bridge. In other words, converter unit 14A may drive an H-bridge made of two half-bridges, half-bridge 26 of converter unit 14A and an additional half-bridge.

In some examples, a switchable clamping element is controlled by each driver of the power converter. For instance, at a half-bridge, a power converter may have a respective driver controlling the high-side switch of the half-bridge and the low-side switch of the half-bridge. The power converter may further include a respective, switchable clamping element at each of the switches of the half-bridge, with each respective driver of the power converter controlling one of the respective switchable clamping elements. Said differently, a high-side driver may control the high-side switch as well as a high-side switchable clamping element for protecting the high-side switch. Likewise, a low-side driver may control the low-side switch as well as a low-side switchable clamping element for protecting the high-side switch.

Rather than using one or more fixed clamping elements like some power converters, power converter 6 includes one or more switchable clamping elements that a driver can selectively turn-on or enable to protect a half-bridge from an impending or actual failure condition at the half-bridge and can selectively turn-off or disable the one or more switchable clamping elements when a failure condition at the half-bridge is less likely to occur. Unlike some other power converters that use one or more fixed clamping elements, the one or more selectable clamping elements are not permanently enabled or turned-on, therefore a failure condition at a half-bridge is not necessarily tied to the breakdown voltage of a clamper. The power converter can disable the switchable clamping elements if the power converter determines that failure conditions are less likely to occur and with the switchable clamping elements disabled, can operate the switches of the half-bridge at an increased working voltage (e.g., a voltage that exceeds the breakdown voltage of the switchable clamping element), with increased efficiency, and with fewer switching losses, than other power converters that use fixed clamping elements.

Figure 4:
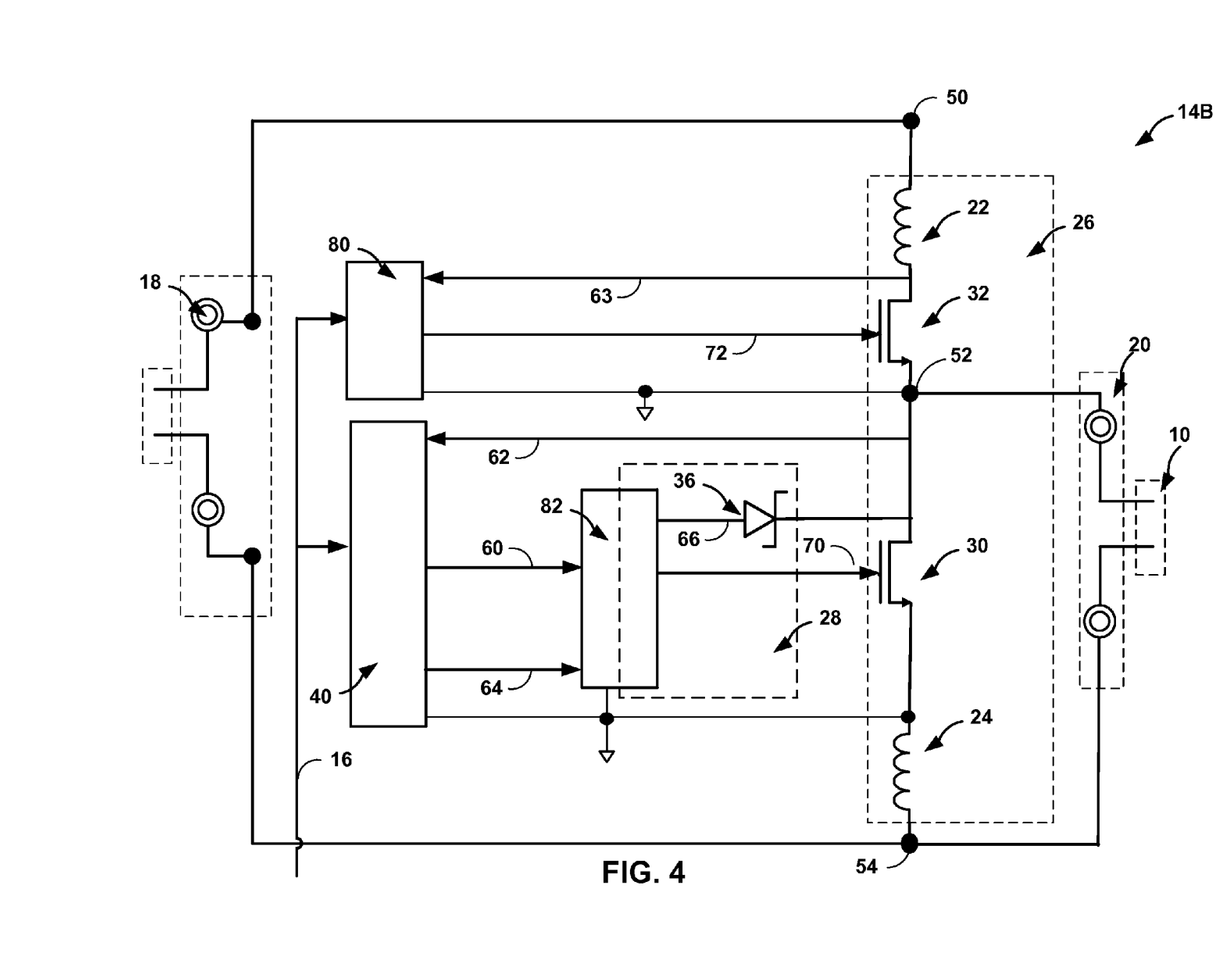
FIG. 4 is a circuit diagram illustrating an additional example converter unit that includes a booster for providing improved gate clamping, in accordance with one or more aspects of the present disclosure.

FIG. 4 is a circuit diagram illustrating an additional example converter unit that includes a booster for providing improved gate clamping, in accordance with one or more aspects of the present disclosure. For instance, FIG. 4 shows converter unit 14B which represents a more detailed exemplary view of converter unit 14 of power converter 6 from FIG. 2. FIG. 4 is described below within the context of system 1 of FIG. 1 and power converter 6 of FIG. 2.

In addition to the components included in converter unit 14A of FIG. 3 and described above with respect to converter unit 14A of FIG. 3, converter unit 14B includes driver 80, booster 82, and links 70 and 72. Booster 82 may be needed if, for example, driver 80 is split into two parts, one low-current part and one high-current part. Partition of driver 80 into two or more parts may be necessary especially for controlling switches with a high demand of gate current and to improve heat dissipation of driver 80. In one implementation, a low-current part 40 and a high-current part (or booster) 82 may be two different units. In another implementation, driver 80 can contain the booster stage and optionally, also the switchable clamping element.

Booster 82 is arranged in-between driver 40 and switch 30 for sinking or driving one or more outputs from driver 40 that booster 82 may receive over link 64 and/or link 60 with sufficient current for controlling switchable clamping element 28 and switch 30. As illustrated by a dotted rectangle shown in FIG. 4 around clamper 36 and part of booster 82, portions of switchable clamping element 28 may reside within (e.g., internal to) booster 82. Although shown as an external component of booster 82, clamper 36 may also reside within booster 82 such that all of switchable clamping element 28 may reside within booster 82.

Booster 82 is configured to enable or disable switchable clamping element 28 to cause switchable clamping element 28 to transition between operating in an off-state of switchable clamping element 28 and an on-state of switchable clamping element 28 (e.g., turn-on or turn-off) based on at least one of the one or more outputs from driver 40. The at least one of the one or more outputs from driver 40 may be based on the voltage across switch 30 or the current at switch 30. For instance, booster 82 may receive an output from driver 40 over link 64 when driver 40 detects an actual failure condition at switch 30 based on a voltage measurement taken via link 62. The output from driver 40 over link 64 may cause booster 82 to enable or disable switchable clamping element 28 based on the voltage across switch 30 or the current at switch 30.

Booster 82 may include an internal switch as a portion of switchable clamping element 28 for enabling or disabling switchable clamping element 28. Booster 82 may be configured to cause the internal switch to transition between operating in an off-state of the internal switch and an on-state of the internal switch (e.g., turn-on or turn-off) based on the voltage detected by driver 40 across the switch 30 or the current at switch 30. For example, based on one or more commands or signals received over link 64 from driver 40 to enable or disable switchable clamping element 28, booster 82 may cause the internal switch of booster 82 to turn-on, and as such, enable switchable clamping element 28 for providing a current path over link 66, through damper 36, and over link 68 in the event that a threshold or activation criteria of clamper 36 is satisfied. Conversely, booster 82 may receive an output from driver 40 to disable switchable clamping element 28 that causes booster 82 to cause the internal switch of booster 82 to operate in an off-state of the internal switch to prevent a current path from forming over link 66, through clamper 36, and over link 68 even if a threshold or activation criteria of clamper 36 is satisfied.

Driver 80 may receive a driver control signal over link 16 from controller unit 12 to cause switch 32 to transition between operating in an on-state and an off-state to modulate an output at switching node 52. For example, driver 80 may output a voltage or current over link 72 that causes switch 32 to turn-on or turn-off based on the driver control signal received over link 16.

In some examples, converter unit 14B may include a second switchable clamping element (e.g., in addition to switchable clamping element 28) coupled to switch 32 for clamping a voltage across switch 32 when both, the second switchable clamping element is enabled, and also, when a threshold or activation criteria of the second switchable clamping element is satisfied. Driver 80 may control (e.g., turn-on or turn-off) switch 32 and control (e.g., enable or disable) the second switchable clamping element. Driver 80 may be configured to control switch 32 based at least in part on the driver control signal received over link 16. Driver 80 may be further configured to control the second switchable clamping element based at least in part on the voltage across switch 32 or the current at switch 32 (e.g., based on information received by driver 80 at link 63).

Figure 5:
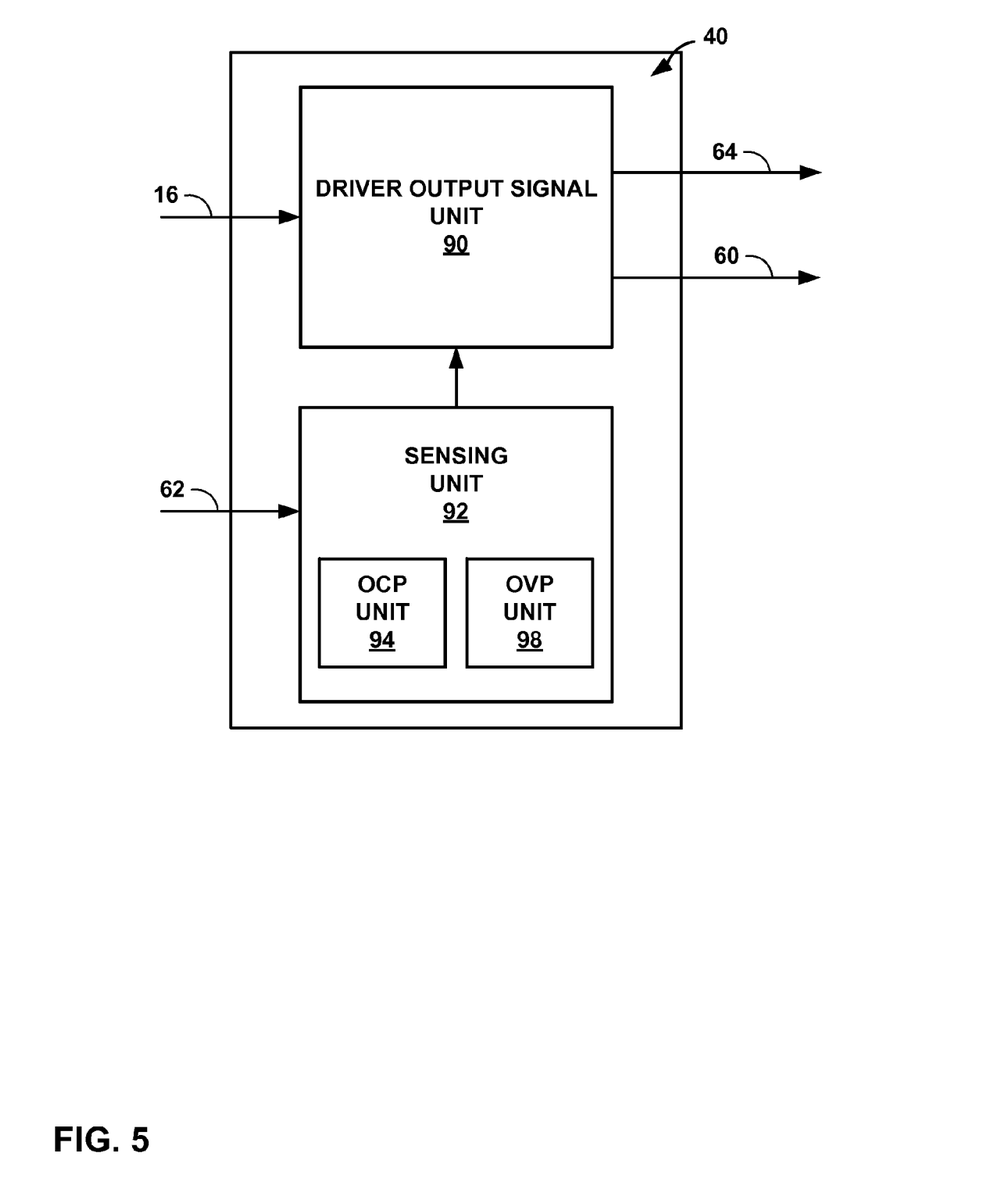
FIG. 5 is a block diagram illustrating an example driver of the example converter unit shown in FIG. 3 and the additional example converter unit shown in FIG. 4.

FIG. 5 is a block diagram illustrating driver 40 of converter unit 14A shown in FIG. 3 and converter unit 14B shown in FIG. 4. FIG. 5 is described below within the context of system 1 of FIG. 1 and power converter 6 of FIG. 2. FIG. 5 is further described below within the context of converter unit 14A of FIG. 3 and, as indicated, within the context of converter unit 14B of FIG. 4.

Driver 40 of FIG. 5 includes driver output signal unit 90, sensing unit 92, and within sensing unit 92, driver 40 includes over-current protection unit 94 (hereafter "OCP unit 94) and over-voltage protection unit 98 (hereafter "OVP unit 98). Driver 40 may include additional or fewer components than those shown in the example of FIG. 5. For example, driver 40 may include additional components, circuits, or elements for controlling switch 30 based on a driver control signal and for controlling switchable clamping element 28 based on a voltage across switch 30 or the current at switch 30.

Driver 40 is coupled to link 16 for receiving a driver control signal from controller unit 12 at driver output signal unit 90. Driver 40 may drive a current or voltage over link 60 to cause switch 30 to turn-on or turn-off (e.g., transition between operating in an on-state of switch 30 and an off-state of switch 30) based on the driver control signal received via link 16. In some examples, such as the example of converter unit 14A of FIG. 3, link 60 may couple driver 40 directly to switch 30 for causing a change in the operating state of switch 30. In some examples, such as the example of converter unit 14B of FIG. 4, link 60 may couple driver 40 to booster 82 of converter unit 14B to cause booster 82 to cause a change in the operating state of switch 30 via a current or voltage at link 70.

In some examples, in addition to receiving a driver control signal over link 16, driver 40 may receive a command or signal from controller unit 12 that indicates either, whether or not controller unit 12 detects an actual of impending failure condition at half-bridge 26 (e.g., based on the voltage or current detected by controller unit 12 at link 8 and/or link 10) or in some cases, the command or signal may indicate a determination made by controller unit 12 for enabling or disabling switchable clamping element 28. Driver output signal unit 90 may drive a command or signal over link 64 based on the command or signal received via link 16 that indicates a failure condition to enable or disable switchable clamping element 28 and cause switchable clamping element 28 to operate in either an on-state or an off-state. In other words, driver 40 may receive information via link 16 directly from controller unit 12 (e.g., an instruction to enable or disable switchable clamping element 28, information about the current or voltage at switch 30, etc.), and based on the information received directly from controller unit 12, driver output signal unit 90 of driver 40 may send a command or signal over link 64 to enable or disable switchable clamping element 28.

Sensing unit 92 of driver 40 may detect whether a failure condition exists or is likely or less likely to exist at half-bridge 26 based on a voltage and/or current detected by driver 40 at switch 30 via link 62. Sensing unit 92 may provide an indication of a failure condition or a lack thereof to driver output signal unit 90 to cause driver output signal unit 90 to enable switchable clamping element 28 by outputting a command over link 64 to cause switchable clamping element 28 to turn-on, or to disable switchable clamping element 28 by outputting a command over link 64 to cause switchable clamping element 28 to turn-off.

Sensing unit 92 includes OCP unit 94 and OVP unit 98. OCP unit 94 provides overcurrent detection functionality for driver 40. OCP unit 94 can detect an overcurrent condition at switch 30 based on information received over link 62. For instance, OCP unit 94 may receive information about a current at switch 30 and determine that the current satisfies (e.g., exceeds) a current threshold that corresponds to the maximum, or within a tolerance of the maximum, current rating that switch 30 can handle. OCP unit 94 may send information to driver output signal unit 90 in response to detecting an overcurrent condition at switch 30 to cause driver 40 to enable (e.g., turn-on) switchable clamping element 28 to protect switch 30 from the overcurrent condition.

OVP unit 98 provides overvoltage detection functionality for driver 40. OVP unit 98 may receive information about a voltage across switch 30 and determine that the voltage satisfies (e.g., exceeds) a voltage threshold that corresponds to the maximum (or near maximum) voltage rating that switch 30 can handle. For example, OVP unit 98 may determine the voltage of switch 30 and determine whether the voltage exceeds, or is within a tolerance of, the voltage rating of switch 30. OVP unit 98 may send information to driver output signal unit 90 in response to detecting an overvoltage condition at switch 30 to cause driver 40 to enable (e.g., turn-on) switchable clamping element 28 to protect switch 30 from the overvoltage condition.

Driver output signal unit 90 of driver 40 may control switchable clamping element 28 by sending commands or signals over link 64 based on information provided by OCP unit 94 and OVP unit 98 that is indicative of a failure condition or lack thereof at switch 30 of half-bridge 26. Driver 40 may control switchable clamping element 28 based on a voltage across switch 30 and whether OVP unit 98 detects an overvoltage condition. Driver 40 may control switchable clamping element 28 based on a current at switch 30 and whether OCP unit 94 detects an overcurrent condition.

Figure 6:
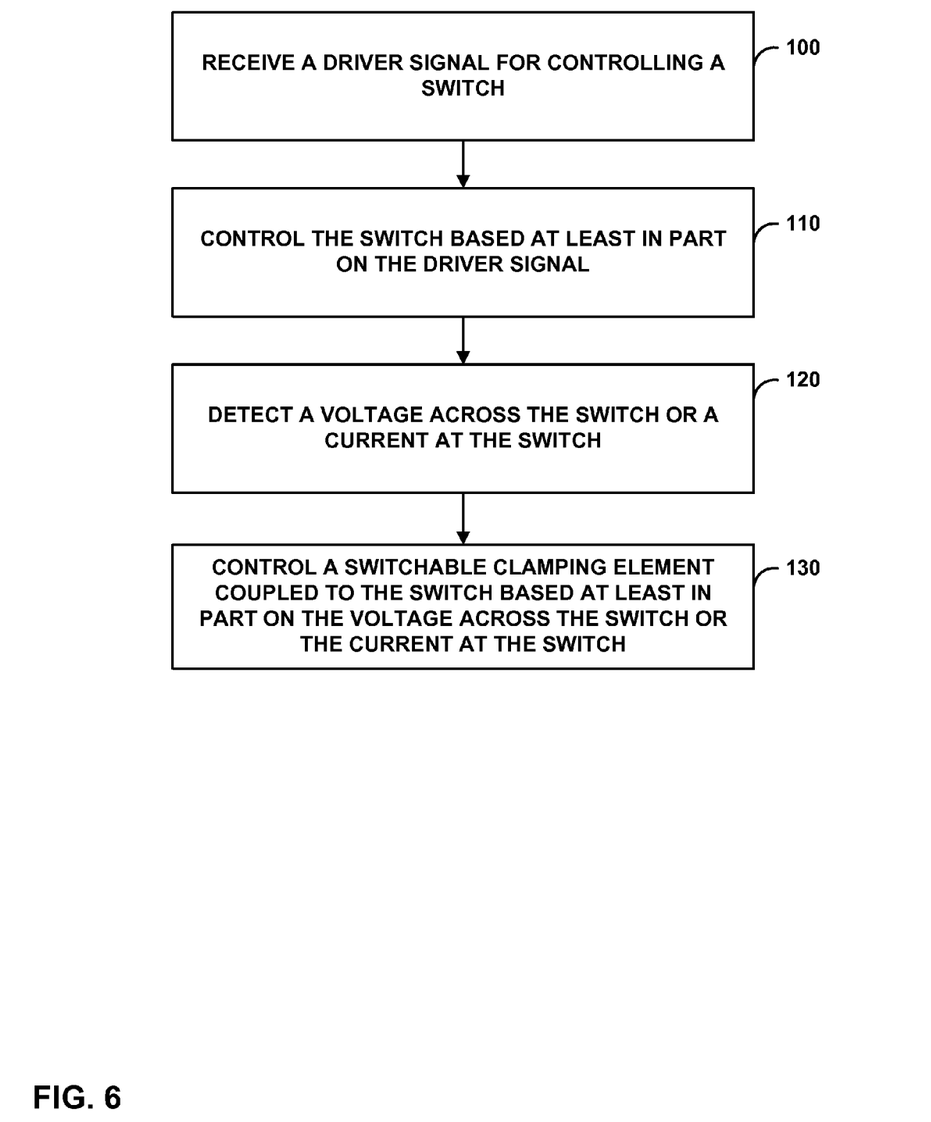
FIG. 6 is a flowchart illustrating example operations of an example power converter, in accordance with one or more aspects of the present disclosure.

FIG. 6 is a flowchart illustrating example operations of an example power converter, in accordance with one or more aspects of the present disclosure. FIG. 6 is described below within the context of system 1 of FIG. 1, power converter 6 of FIG. 2, and converter unit 14A of FIG. 3.

A driver may receive a driver control signal for controlling a switch (100). For example, driver 40 may receive a driver control signal from controller unit 12 over link 16 for modulating switch 30 according to a PWM, PDM, or other suitable modulation technique to produce a power output having a particular voltage or current level at switching node 52 based on the voltage level of a power input at port 18.

The driver may control the switch based at least in part on the driver control signal (110). For example, driver 40 may send one or more commands over link 60 that directly causes (or indirectly cause by passing through a booster) switch 30 to transition between operating in an on-state and an off-state according to the driver control signal.

The driver may detect a voltage across the switch or a current at the switch (120). For example, driver 40 may receive information over link 62 that indicates the current at switch 30 or the voltage across switch 30. Driver 40 may compare the information received over link 62 to a threshold for determining whether a failure condition (e.g., overcurrent, overvoltage, etc.) exists at half-bridge 26, or whether a failure condition is likely to occur or less likely to occur at half-bridge 26.

The driver may control a switchable clamping element coupled to the switch based at least in part on the voltage across the switch or the current at the switch (130). For example, driver 40 may determine that either the voltage or the current satisfies the threshold for indicating that a failure condition is occurring or is likely to occur at half-bridge 26. Driver 40 may send a command over link 64 to enable switchable clamping element 28 and configure switchable clamping element 28 for protecting switch 30 from the failure condition by creating a current path through switchable clamping element 28 if a threshold or other activation criteria of switchable clamping element 28 is satisfied. Otherwise, driver 40 may determine that neither the voltage, nor the current satisfies the threshold for indicating that a failure condition is occurring or is likely to occur at half-bridge 26. Driver 40 may send a command over link 64 that disables switchable clamping element 28 and configure switchable clamping element 28 to prevent a current path from forming through switchable clamping element 28 even if a threshold or activation criteria of switchable clamping element 28 is satisfied. By disabling switchable clamping element 28, power converter 6 can operate switch 30 at a higher working voltage (e.g., a voltage may exceed the breakdown voltage of clamper 36 of switchable clamping element 28).

Figure 7:
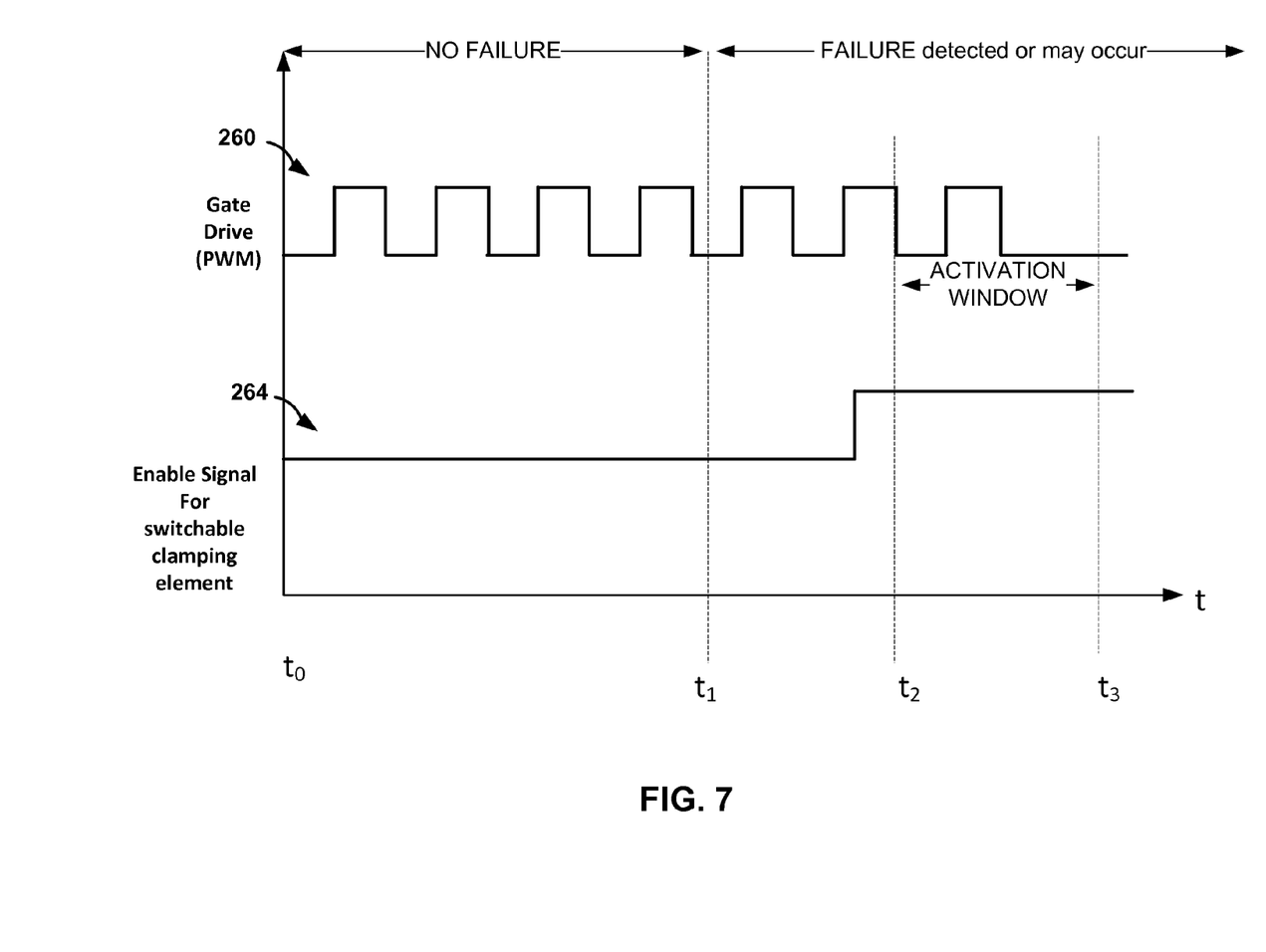
FIG. 7 is a timing diagram illustrating various timing characteristics of one or more aspects of the present disclosure.

FIG. 7 is a flowchart illustrating example timing diagrams of one or more aspects of the present disclosure. FIG. 7 is described below within the context of system 1 of FIG. 1, power converter 6 of FIG. 2, and converter unit 14A of FIG. 3. Plot 260 of FIG. 7 shows the signal (e.g., a PWM signal) generated by driver 40 over link 60 to control switch 30 in accordance with a modulation technique. Plot 264 of FIG. 7 shows the signal generated by driver 40 over link 64 for controlling (e.g., enabling or disabling) switchable clamping element 28 (e.g., switch 34).

FIG. 7 shows that, between time $t_0$ and time $t_1$, driver 40 outputs a "disable" switchable clamping element signal over link 64 after determining that a failure condition is not detected at switch 30 or after determining that a failure condition is not likely to occur at switch 30. With switchable clamping element 28 disabled, a current path is prevented from forming through clamper 36 even if a threshold or activation criteria of clamper 36 is satisfied by the voltage and/or current level at switch 30.

At time $t_1$, driver 40 may detect that a failure condition is occurring or is likely to occur at switch 30 (e.g., based on a voltage and/or current measurement across link 62 being sensed by driver 40 or controller unit 12). Responsive to detecting the failure condition or impending failure condition, driver 40 may enable switchable clamping element 28 by outputting an enable signal over link 64 to cause switch 34 of switchable clamping element 28 to operate in the on-state. With switchable clamping element 28 turned-on or "enabled," a current path can form through clamper 36 of switchable clamping element 28 if a threshold or other activation criteria of clamper 36 is satisfied. For instance, at time t2, the voltage at switch 30 may exceed the breakdown voltage of clamper 36, and until the voltage at switch 30 decreases below the breakdown voltage of clamper 36 at time t3, clamper 36 causes a current path to form through switchable clamping element 28 to divert excess current away from switch 30. In some examples, the amount of time between time t2 and t3 (e.g., the "activation window") may provide sufficient time for driver 40 to safely turnoff switch 30 (e.g., and prevent the failure condition from damaging switch 30). In some examples, after the failure condition is detected, controller unit 12 and/or driver 40 may hold the driver control signal (e.g., cease modulating the PWM) in the current state when the failure condition is detected, to further avoid any damage to the switch 30.

Clause 1. A circuit comprising: a switch; a switchable clamping element coupled to the switch; and a driver configured to control the switch based at least in part on a driver control signal, the driver being further configured to enable or disable the switchable clamping element, and wherein the switchable clamping element is configured to clamp a voltage across the switch when the switchable clamping element is enabled by the driver and when the voltage across the switch or a current at the switch satisfies a threshold for activating the switchable clamping element.

Clause 2. The circuit of clause 1, wherein the switchable clamping element is configured to refrain from clamping the voltage across the switch when the switchable clamping element is disabled.

Clause 3. The circuit of any of clauses 1-2, wherein the switchable clamping element is configured to refrain from clamping the voltage across the switch when the switchable clamping element is disabled and if the voltage across the switch or the current at the switch satisfies the threshold for activating the switchable clamping element.

Clause 4. The circuit of any of clauses 1-3, wherein the threshold for activating the switchable clamping element corresponds to a breakdown voltage or a breakdown current associated with the selectable clamping element.

Clause 5. The circuit of any of clauses 1-4, wherein the switch is a first switch, and wherein the switchable clamping element comprises a second switch and a clamper.

Clause 6. The circuit of clause 5, wherein the clamper comprises at least one of a Zener diode, a transient voltage suppressant diode, and an avalanche diode.

Clause 7. The circuit of any of clauses 5-6, wherein the driver is configured to enable the switchable clamping element by at least causing the second switch to operate in an on-state of the second switch, and wherein the driver is configured to disable the switchable clamping element by at least causing the second switch to operate in an off-state of the second switch.

Clause 8. The circuit of any of clauses 1-7, wherein the driver is further configured to enable or disable the switchable clamping element based at least in part on a voltage across the switch or a current at the switch.

Clause 9. The circuit of any of clause 1-8, wherein the driver is further configured to receive a clamping control signal, the driver being further configured to enable or disable the switchable clamping element based on the clamping control signal.

Clause 10. The circuit of any of clauses 1-9, wherein the switch comprises a Gallium Nitride-based switch device.

Clause 11. The circuit of any of clauses 1-10, wherein the switch is a first switch, wherein the switchable clamping element is a first switchable clamping element, wherein the voltage across the first switch is a first voltage, wherein the current at the first switch is a first current, wherein the threshold is a first threshold, and wherein the driver is a first driver, the circuit further comprising: a half-bridge comprising the first switch coupled to a second switch at a switching node of the half-bridge; a second switchable clamping element coupled to the second switch; and a second driver configured to control the second switch based at least in part on the driver control signal, the second driver being further configured to enable or disable the second switchable clamping element, and wherein the second switchable clamping element is configured to clamp a second voltage across the second switch when the second switchable clamping element is enabled by the second driver and when the second voltage across the second switch or a second current at the switch satisfies a second threshold for activating the second switchable clamping element.

Clause 12. The circuit of clause 11, wherein the second driver is further configured to enable or disable the second switchable clamping element based at least in part on the second voltage across the second switch or the second current at the second switch.

Clause 13. The circuit of any of clauses 11-12, wherein the driver control signal is a first driver control signal, and wherein the second driver is further configured to control the second switch based at least in part on a second driver control signal received by the second driver.

Clause 14. The circuit of any of clauses 1-13, wherein the switchable clamping element comprises a type of normally-enabled and is configured to clamp the voltage across the switch when the voltage across the switch or the current at the switch satisfies the threshold and the driver is disabled.

Clause 15. The circuit of any of clauses 1-14, wherein the switchable clamping element comprises a type of normally-disabled and is configured to refrain from clamping the voltage across the switch when the driver is disabled.

Clause 16. A method comprising: controlling, by a driver configured to control a switch, a switchable clamping element coupled to the switch based at least in part on a voltage across the switch or a current at the switch, wherein the switchable clamping element is configured to clamp the voltage across the switch when the switchable clamping element is enabled by the driver and when the voltage across the switch or the current at the switch satisfies a threshold for activating the switchable clamping element.

Clause 17. The method of clause 16, further comprising: detecting, by the driver, the voltage across the switch or the current at the switch, wherein the driver is configured to control the switchable clamping element coupled to the switch based at least in part on the detected voltage across the switch or the detected current across the switch.

Clause 18. The method of any of clauses 16-17, further comprising: detecting, by the driver, a failure condition at the switch based on the voltage across the switch or the current at the switch; and enabling, by the driver, the switchable clamping element in response to detecting the impending or actual failure condition at the switch.

Clause 19. The method of any of clauses 16-18, further comprising: receiving, by the driver, information from a controller, wherein the driver controls the switchable clamping element coupled to the switch based at least in part on the information received from the controller, wherein the information received from the controller comprises at least one of an indication of a failure condition detected at the first switch and an indication of an instruction from the controller for enabling or disabling the switchable clamping element.

Clause 20. A circuit comprising: means for controlling a switchable clamping element coupled to a switch based at least in part on a voltage across the switch or a current at the switch, wherein the switchable clamping element is configured to clamp the voltage across the switch when the switchable clamping element is enabled by the driver and when the voltage across the switch or the current at the switch satisfies a threshold for activating the switchable clamping element.

The techniques of this disclosure may be implemented in a wide variety of devices or apparatuses, including an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

Various examples have been described. These and other examples are within the scope of the following claims.

What is claimed is:

1. A circuit comprising:
   a switch;
   a switchable clamping element coupled to the switch; and
   a driver configured to control the switch based at least in part on a driver control signal and enable or disable the switchable clamping element, wherein the switchable clamping element is configured to:
   clamp a voltage across the switch when the switchable clamping element is enabled by the driver and the voltage across the switch or a current at the switch satisfies a threshold for activating the switchable clamping element; and
   refrain from clamping the voltage across the switch when the switchable clamping element is disabled and the voltage across the switch or the current at the switch satisfies the threshold for activating the switchable clamping element.

2. The circuit of claim 1, wherein the threshold for activating the switchable clamping element corresponds to a breakdown voltage or a breakdown current associated with the switchable clamping element.

3. The circuit of claim 1, wherein the switch is a first switch, and wherein the switchable clamping element comprises a second switch and a clamper.

4. The circuit of claim 3, wherein the clamper comprises at least one of a Zener diode, a transient voltage suppressant diode, and an avalanche diode.

5. The circuit of claim 3, wherein the driver is configured to enable the switchable clamping element by at least causing the second switch to operate in an on-state of the second switch, and wherein the driver is configured to disable the switchable clamping element by at least causing the second switch to operate in an off-state of the second switch.

6. The circuit of claim 1, wherein the driver is further configured to enable or disable the switchable clamping element based at least in part on a voltage across the switch or a current at the switch.

7. The circuit of claim 1, wherein the driver is further configured to receive a clamping control signal, the driver being further configured to enable or disable the switchable clamping element based on the clamping control signal.

8. The circuit of claim 1, wherein the switch comprises a Gallium Nitride-based switch device.

9. The circuit of claim 1, wherein the switch is a first switch, wherein the switchable clamping element is a first switchable clamping element, wherein the voltage across the first switch is a first voltage, wherein the current at the first switch is a first current, wherein the threshold is a first threshold, and wherein the driver is a first driver, the circuit further comprising:
   a half-bridge comprising the first switch coupled to a second switch at a switching node of the half-bridge;
   a second switchable clamping element coupled to the second switch; and
   a second driver configured to control the second switch based at least in part on the driver control signal, the second driver being further configured to enable or disable the second switchable clamping element, and
   wherein the second switchable clamping element is configured to clamp a second voltage across the second switch when the second switchable clamping element is enabled by the second driver and when the second voltage across the switch or a second current at the switch satisfies a second threshold for activating the second switchable clamping element.

10. The circuit of claim 9, wherein the second driver is further configured to enable or disable the second switchable clamping element based at least in part on the second voltage across the second switch or the second current at the second switch.

11. The circuit of claim 9, wherein the driver control signal is a first driver control signal, and wherein the second driver is further configured to control the second switch based at least in part on a second driver control signal received by the second driver.

12. The circuit of claim 1, wherein the switchable clamping element is a normally-enabled type of switchable clamping element and is configured to clamp the voltage across the switch when the voltage across the switch or the current at the switch satisfies the threshold and the driver is disabled.

13. The circuit of claim 1, wherein the switchable clamping element is a normally-disabled type of switchable clamping element and is configured to refrain from clamping the voltage across the switch when the driver is disabled.

14. A method comprising:
controlling, by a driver configured to control a switch, a switchable clamping element coupled to the switch based at least in part on a voltage across the switch or a current at the switch, wherein the switchable clamping element is configured to:
clamp the voltage across the switch when the switchable clamping element is enabled by the driver and the voltage across the switch or the current at the switch satisfies a threshold for activating the switchable clamping element; and
refrain from clamping the voltage across the switch when the switchable clamping element is disabled by the driver and the voltage across the switch or the current at the switch satisfies the threshold for activating the switchable clamping element.

15. The method of claim 14, further comprising:
detecting, by the driver, the voltage across the switch or the current at the switch, wherein the driver is configured to control the switchable clamping element coupled to the switch based at least in part on the detected voltage across the switch or the detected current at the switch.

16. The method of claim 14, further comprising:
detecting, by the driver, a failure condition at the switch based on the voltage across the switch or the current at the switch; and
enabling, by the driver, the switchable clamping element in response to detecting the impending or actual failure condition at the switch.

17. The method of claim 14, further comprising:
receiving, by the driver, information from a controller, wherein the driver controls the switchable clamping element coupled to the switch based at least in part on the information received from the controller, wherein the information received from the controller comprises at least one of an indication of a failure condition detected at the first switch and an indication of an instruction from the controller for enabling or disabling the switchable clamping element.

18. The method of claim 14, wherein the switch is a first switch and the switchable clamping element comprises a second switch and a clamper.

19. A circuit comprising:
means for controlling a switchable clamping element coupled to a switch based at least in part on a voltage across the switch or a current at the switch, wherein the switchable clamping element is configured to:
clamp the voltage across the switch when the switchable clamping element is enabled by a driver and the voltage across the switch or the current at the switch satisfies a threshold for activating the switchable clamping element; and
refrain from clamping the voltage across the switch when the switchable clamping element is disabled and the voltage across the switch or the current at the switch satisfies the threshold for activating the switchable clamping element.

20. The circuit of claim 19, wherein the switch is a Gallium Nitride-based switch.

* * * * *